United States Patent
Salisbury

[19]

[11] Patent Number: 5,976,978
[45] Date of Patent: Nov. 2, 1999

[54] PROCESS FOR REPAIRING DATA TRANSMISSION LINES OF IMAGERS

[75] Inventor: Roger Stephen Salisbury, Niskayuna, N.Y.

[73] Assignee: General Electric Company, Schenectady, N.Y.

[21] Appl. No.: 08/996,427

[22] Filed: Dec. 22, 1997

[51] Int. Cl.⁶ .............................. H01L 21/00; B44C 1/22
[52] U.S. Cl. ............................. 438/690; 216/21; 216/23; 216/65; 257/59; 349/139; 438/4; 438/707
[58] Field of Search .................................. 216/21, 23, 65; 438/4, 98, 598, 690, 707, 720, 742, 609; 359/59, 87; 257/59, 292; 324/537; 349/139, 141, 147; 250/370.09

[56] References Cited

U.S. PATENT DOCUMENTS

| | | |
|---|---|---|
| 4,688,896 | 8/1987 | Castleberry . |
| 5,019,001 | 5/1991 | Abe et al. ............................. 216/21 X |
| 5,303,074 | 4/1994 | Salisbury . |
| 5,451,292 | 9/1995 | Shimamune et al. ..................... 216/23 |
| 5,475,246 | 12/1995 | Wei et al. . |
| 5,480,812 | 1/1996 | Salisbury . |
| 5,518,956 | 5/1996 | Liu et al. . |
| 5,552,607 | 9/1996 | Salisbury et al. . |
| 5,555,001 | 9/1996 | Lee et al. . |
| 5,616,524 | 4/1997 | Wei et al. . |
| 5,648,296 | 7/1997 | Salisbury . |

FOREIGN PATENT DOCUMENTS 0539981 5/1993 European Pat. Off. .

Primary Examiner—William Powell
Attorney, Agent, or Firm—Donald S. Ingraham; Douglas E. Stoner

[57] ABSTRACT

A method of repairing severed or damaged data transmission lines of an imager provides a shunt path around the electrical defect in the data transmission line by means of a diode common transmission line. The repair shunt includes a first scan line segment, a common electrode segment, and a second scan line segment, which segments are fused together and to the data line having the electrical defect to bypass the electrical defect. The respective conductive lines are fused together with spot welds formed with the application of a laser. A repaired imager has a data line having an open circuit defect, with respective first and second portions of said data line being coupled to a repair shunt comprising an associated pixel scan line segment and a common electrode segment. In one embodiment of the present invention, a plurality of spot welds are provided in the imager array, each in its unwelded state but capable of being welded by the application of heat.

21 Claims, 2 Drawing Sheets

PROCESS FOR REPAIRING DATA TRANSMISSION LINES OF IMAGERS

BACKGROUND OF THE INVENTION

Portions of this invention were made with Government support under Government Contract No. MDA 97294-30028 awarded by DARPA. The Government has certain rights in this invention.

1. Field of the Invention

The field of the invention is imaging or display arrays having address transmission lines, i.e., scan and data transmission lines, and more particularly, to a process for repairing transmission lines that become damaged during the fabrication process of the imager or display arrays.

2. Background

Solid state radiation imagers are commonly formed on a substantially flat substrate, typically glass, and comprise an array of pixels that are used for generating an electrical signal corresponding to the incident radiation. Each pixel includes a photosensitive element, typically a photodiode, and an associated switching element, preferably a field-effect transistor (FET). The array of pixels is typically arranged in a row-column matrix, with each pixel addressed by two electrical transmission lines, a scan transmission line and a data transmission line. The scan lines are typically oriented along rows of the pixel array and coupled to the gate electrode of pixel in that row, with signals applied to the scan lines determining whether the FET is in a conductive or non-conductive state. Data lines are typically oriented along columns of the pixel array and are coupled to source electrodes of the respective pixel FETS in that column, and are used to transfer the electrical signal (corresponding to the charge accumulated on the photosensor during a period of radiation exposure) to readout electronics coupled to the array. The photosensor is further coupled to a common electrode, which electrically connects one contact of the photodiodes in parallel. In various embodiments, the common electrode comprises molybdenum, and in other embodiments the common electrode comprises a layer of indium tin oxide (ITO) which overlays the pixel array.

The operability of the imagers is dependent upon the electrical integrity of the data transmission lines to provide necessary low noise contact to each photosensor to which it is coupled. More particularly, the data transmission lines need to be functional after the completion of all the processing steps for fabricating the imager. However, damage to these transmission lines may occur during processing steps in forming the various components of the imager, such as deposition and patterning of layers of conductive, semiconductive, and dielectric materials to form the photodiodes and FETS and coupled them together in the pixel array. Damaged data lines having open circuit condition render can render significant portions or an entire column of pixels inoperative. A repair process for reestablishing electrical integrity in a severed or damaged data transmission lines is thus helpful to enhance imager performance and increase yield in the fabrication process.

A process for repairing data transmission lines that may have become severed or damaged during the processing steps of the imager desirably is a simple process so as not to unduly degrade the efficiency of the imager fabrication processes and that the integrity of the repair be verifiable in a quick and convenient manner. It also desirable that the have sufficient electrical integrity to provide reliable low noise electrical contact along the data line to maintain imager performance characteristics.

SUMMARY OF THE INVENTION

The present invention is directed to repair of address lines in a solid state radiation imager. The imager comprises a plurality of pixels, each of which comprises a photosensor and an associated switching transistor. The imager further comprises a plurality of address lines, including a plurality of scan lines that are oriented in respective rows and are coupled to respective gate electrodes of pixel switching transistors in that row, and a plurality of data lines that are oriented in respective columns and are coupled to respective source electrodes of pixel switching transistors in that column. The array further comprises a plurality of photosensor common electrode lines oriented substantially parallel to and disposed between respective ones of said data lines.

The present invention provides a method of repairing a severed data line, even in an imager that has reached the production stage where all pixels and address lines have been fabricated. Once the location of the defect (open electrical connection) in the data line is determined, an electrical repair shunt around the defect is formed by electrically isolating respective segments of associated pixel scan lines and common electrode lines, fusing the scan line shunt segments to the associated pixel common electrode repair segment, and fusing the defective data line to the repair shunt.

A repaired imager in accordance with this invention has a data line having an open circuit defect, with respective first and second portions of said data line being coupled to a repair shunt comprising an associated pixel scan line segment and a common electrode segment. In one embodiment of the present invention, a plurality of spot welds are provided in the imager array, each in its unwelded state but capable of being welded by the application of heat, with at least one spot weld is placed on each scan line and on each data line in a position to provide fusible contact points for forming the repair shunt.

BRIEF DESCRIPTION OF THE DRAWINGS

The features of the invention believed to be novel are set forth with particularity in the appended claims. The invention itself, however, both as to organization and a method of operation, together with further objects and advantages thereof, may best be understood by reference to the following description taken in conjunction with the accompanying drawings in which like characters represent like parts throughout the drawings, and in which:

DETAILED DESCRIPTION OF THE INVENTION

Figure 1:
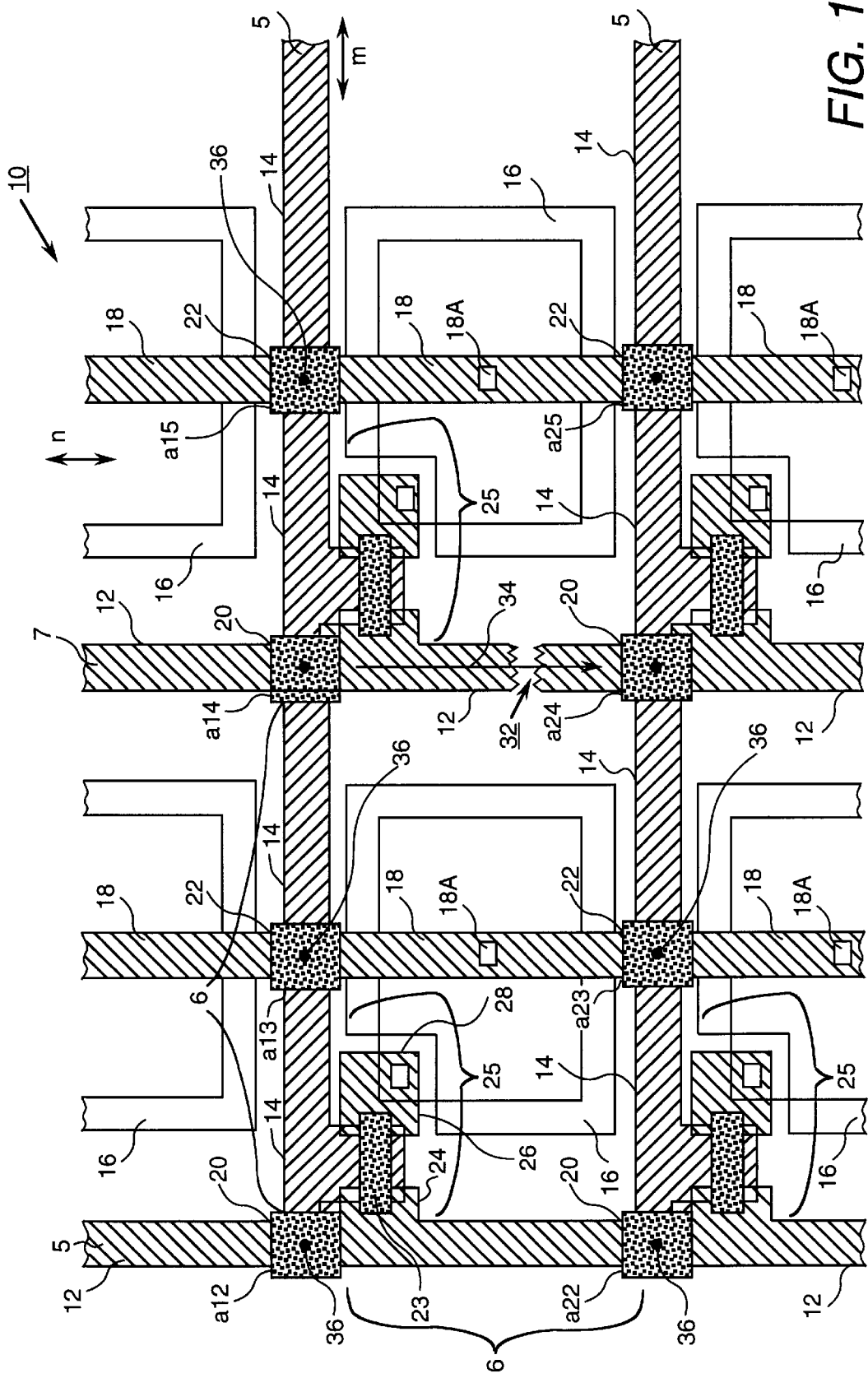
FIG. 1 is a schematic illustrating a portion of an imager comprising a pixel array having an electrical defect in a data line of the array.

A solid state radiation imager 10, such as may be used for X-ray imaging, is illustrated in part in FIG. 1. Imager 10 comprises an array of pixels 6 disposed in rows and columns that comprise a photosensor array used to generate electrical signals corresponding to radiation incident on the imager (in an x-ray imager, a scintillator material (not shown) absorbs the incident x-rays and in turn generates optical photons that are detected by the photosensor array). Each pixel typically comprises a photosensor 16 (typically a photodiode) and an associated switching transistor 25, and is coupled to two respective address lines 5. Address lines 5 are disposed in an array of rows and columns; as illustrated in FIG. 1, one set of address comprises data lines 12 (coupled to the diode for readout of charge accumulated on the diode) and another set of address lines comprises scan lines 14 (coupled to the respective pixel switching transistor 25 to cause the transistor to be in a conductive or non-conductive state). Photodiodes 16 are further coupled to diode common transmission lines 18 via a conductive pad 18A. The location in the array of particular pixels 6, and the pixel's associated photodiode and address lines, can be defined with coordinates to specify the location of a row and a column of scan, data, diode common transmission lines of the imager 10.

In a common embodiment, data transmission lines 12 typically comprise molybdenum; scan data transmission lines 14 typically comprise chromium, molybdenum, or a combination thereof; and diode common transmission lines 18 comprise molybdenum or alternatively indium tin oxide. Scan lines 14 are arranged so as to form and interconnect the m rows (depicted as disposed horizontally in the figures) of imager 10, and the n columns (depicted as oriented vertically in the figures) are formed by respective data transmission lines 12 as shown in FIG. 1. For such an arrangement, the respective positions in the array where scan lines 14 underlie data transmission lines 12 (the scan lines and data lines normally being electrically isolated from one another by intervening layers of a dielectric material) define respective scan-data crossover elements 20. Further, the positions in the array where scan lines 14 underlie diode common electrode lines 18 (the scan and common electrode lines being normally electrically isolated from the other by an intervening layer of dielectric material) define respective scan-common electrode crossover elements 22. The scan-data line crossover elements 20 and scan-common crossover elements 22 are located at the elements of the matrix of the imager 10, such as $a_{12}$, $a_{13}$ . . . $a_{25}$ shown in FIG. 1.

The imager 10 further comprises a plurality of respective pixel switching elements 25 located proximate to each of the scan-data crossover elements 20. The switching element typically comprises a thin film field effect transistor (commonly referred to as "TFTs" or "FETs") having a gate electrode 23 coupled to a respective pixel scan line 14; a source electrode 24 coupled to the respective column data line 12; a drain electrode 26 coupled to the pixel diode. In operation, a signal (e.g., a voltage applied to scan line 12) applied to respective scan lines 14 causes each pixel FET 25 coupled to that scan line to become conductive, thereby coupling diode 16 to the respective pixel data line via source and drain electrodes 24, 26. Similarly, removal of the electrical signal from scan line 14 causes the respective pixel FETS to become non-conductive.

At times fabrication processes (e.g., masking and etching) result in electrical defects in data lines; as used herein, "electrical defect" and the like refer to open circuit conditions or alternatively very high resistance connections that make the data line unserviceable because of the high level of noise in the line introduced by transmissions over the defect. One example of such an electrical defect 32 is illustrated in FIG. 1, in which defect 32 is represented as an open circuit condition in defective data address line 7. Defect 32 is a break in the data transmission line that interconnects the matrix locations $a_{14}$ and $a_{24}$ so as to break the electrical path 34 therebetween.

Figure 2:
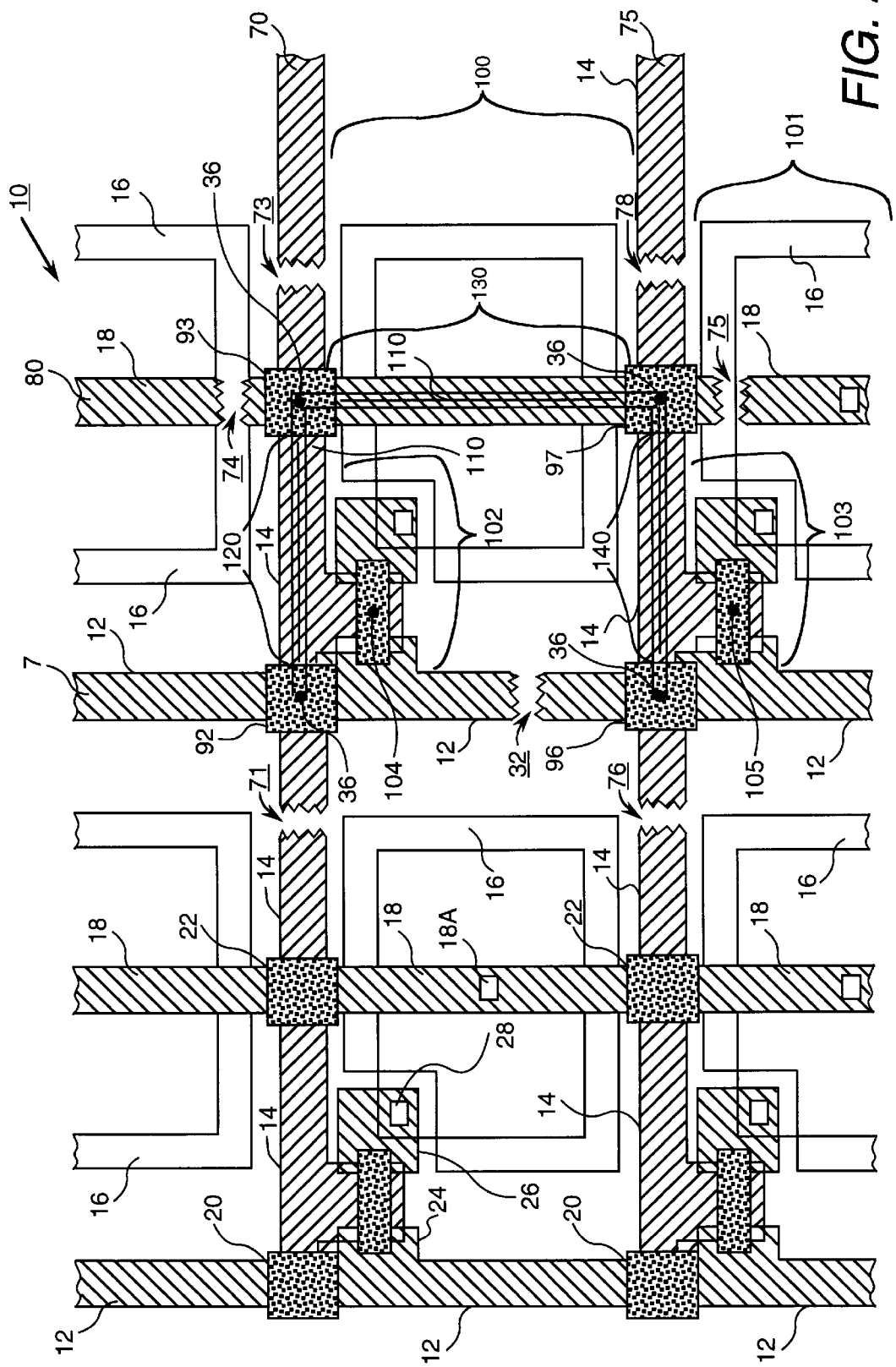
FIG. 2 depicts a repair shunt arrangement coupled to the data line with an electrical defect in accordance with the present invention.

In one embodiment of the present invention, a plurality of weld pads 36 are provided, typically at each scan-data line crossover 20 and at each scan-common electrode crossover 22, as is illustrated in FIG. 2. These weld pads 36 are formed during the fabrication process of the imager 10 and each is disposed at the respective crossover points on scan lines 14 in its non-welded state but is also in a condition that it is capable of being welded to the conductive material of the overlying address line in the crossover point by the application of heat. The heat may be applied by an excimer laser, or xenon laser. Weld pads typically comprise molybdenum and chromium (same material as scan line) and have dimensions of about 15 microns by 15 microns.

One aspect of post-fabrication checks on an imager panel is the identification of electrical defects in scan lines—as noted above, such a defect can have a deleterious effect on a significant number of pixels service by that line if left uncorrected. Electrical tests are used to identify lines with defects and visual examination (e.g., with a microscope) is used to identify the location of a defect in a data line. A repair area pixel 100 (FIG. 2) is also identified; the repair area pixel 100 is the pixel coupled to defective data line 7 and that is adjacent to (that is, between respective scan-data line crossover points 20) defining a pixel row.

Once electrical defect 32 in defective data line 7 is identified, the process of repairing data line 7 includes the steps of forming a repair shunt 110 (schematically represented by the dark line over portions of preexisting conductive lines 14 and 18 in FIG. 2) and fusing the repair shunt to defective data line 7 so as to electrically bypass defect 32. As used herein, "fusing" and the like is used to refer to forming an electrical connection between two lines, typically by application of heat to melt the conductive material of the two lines to be connected and to remove dielectric material between the two lines to enable the making of the electrical connection. One example is the application, that is, directing the beam of a laser, such as an excimer laser, in the region to be fused so as to weld the two conductive lines together and ablate intervening dielectric material.

Formation of repair shunt 110 includes the steps of forming a first pixel scan line segment 120, a common electrode segment 130, and a second pixel line segment 140 (these segments are also referred to collectively as the "repair segments"). First pixel scan line segment 120 comprises a portion of a first scan line 70 that is coupled to the FET 102 coupled to repair area pixel 100; common electrode segment 130 comprises a portion of a repair common electrode line 80 that overlies repair area pixel 100; and second scan line segment 140 comprises a portion of a second scan line 75 disposed on the opposite side of repair pixel 100 from first scan line 120 (that is, the scan line for the next row of pixels below (as illustrated in FIG. 2) the scan line coupled to repair area pixel 100).

First scan line repair segment 120 is formed by electrically isolating segment 120 from the remainder of first scan line 70. The electrical isolation is typically done by severing scan line 70 at first scan line sever locations 71 and 73. Sever location 71 is typically disposed on scan line 70 between a first repair shunt scan-data line crossover element 92 (adjacent FET 102 for repair area pixel 100) and the edge of the array (that is, the end of the scan line that is coupled to readout electronics on the left side of the array as illustrated in FIG. 2), and sever location 73 is disposed on scan line 70 between a first scan-common electrode crossover element 93 and the edge of the array (that is, opposite end of first scan line 70 that is coupled to readout electronics on the right side of the array as illustrated in FIG. 2). For each of the repair segments (including both scan line and common electrode line repair segments) discussed herein, each of the sever points is typically disposed in relatively close proximity to the associated crossover element, but in any it is typically situated so as to not electrically isolate pixels other than repair area pixel 100.

Similarly, second scan line segment 130 is formed by electrically isolating segment 140 by severing second scan line 75 at second scan line sever locations 76 and 78. Second scan line sever location 76 is disposed on second scan line 75 a second scan-common electrode crossover element 97 and the edge of the array (that is, opposite end of second scan line 75 that is coupled to readout electronics on the right side of the array as illustrated in FIG. 2); second scan line sever location 78 is disposed on second scan line 75 between a second scan-common electrode crossover element 97 and the edge of the array (that is, opposite end of second scan line 75 that is coupled to readout electronics on the right side of the array as illustrated in FIG. 2).

Common electrode segment 130 is formed by severing repair common electrode line 80 at sever points 74 and 75. Sever point 74 is disposed on repair common electrode line 80 between first scan common electrode crossover element 93 and the edge of the array (that is, the end of the common electrode line 80 coupled to bias source at the edge of the array in the upper direction as illustrated in FIG. 2). Sever point 75 is disposed on repair common electrode line 80 between second scan common electrode crossover element 97 and the opposite edge of the array (that is, the end of the common electrode line 80 coupled to bias source at the edge of the array in the lower direction as illustrated in FIG. 2).

Sever points for each of the repair segments is typically made by applying heat, such as by directing a laser beam (such as from an excimer or xenon laser), on the area of the conductive line to be severed so as to ablate the conductive material and create an open circuit electrical condition at the sever point.

The three repair segments, that is first scan line segment 120, common electrode segment 130, and second scan line segment 140, are then fused together to make repair shunt 110 electrically conductive. First scan line segment is welded to common electrode segment 130 at first scan-common electrode line crossover element 93, and common electrode element 130 is welded to second scan line segment 140 at second scan-common electrode crossover element 97. In embodiments of the invention comprising respective weld pads 36, the welding of the address lines together at the crossover points is typically accomplished by applying the laser to the crossover element in the vicinity of the weld pad to effect the electrical fusing of the two conductive lines.

Repair shunt 110 is then fused to repair data line 7 to provide the electrical bypass of defect 32 in repair data line 7. In one embodiment of the present invention, electrical connection between repair shunt 110 and repair data line 7 is made via respective weld connections at first scan-data crossover element 92 and at second scan-data line crossover element 96 by fusing the two conductive lines together at the respective crossover elements (that is, forming the respective weld connections). As noted above, in embodiments of the invention comprising weld pads 36, such electrical fusing (or welding) the lines is done in the vicinity of the respective weld pads 36 situated at the crossover elements.

In an alternative embodiment of the present invention, fusing of repair shunt 110 to repair data line 7 comprises forming respective first and second pixel FET weld connections 104 and 105. First pixel FET weld connection 104 is disposed on repair pixel FET 102, and second pixel FET weld connection 105 in disposed on a second repair pixel 101 (that is, the pixel coupled to second scan line 75 in the same column as repair pixel 100). Respective first and second pixel FET weld connections 104 and 105 are formed by applying a laser (such as an excimer or xenon laser) to the channel region of the respective FET to remove dielectric material therein and to weld the conductive material of the respective FET source electrode 24 (FIG. 1) that is coupled to repair data line 7 to the conductive material of the respective FET gate electrode 23 that is coupled to the respective scan line repair segment. These FET weld connections 104, 105 thus serve to electrically coupled repair data line 7 to the respective scan line repair segments 120, 140 of repair shunt 110.

In a further alternative embodiment of the present invention, repair shunt 110 is electrically coupled to repair data line 7 by both respective first and second scan-data line crossover weld connections 92, 96 and respective first and second pixel FET weld connections 104, 105. One advantage of having parallel connections to repair data line 7 is lower electrical noise on data line 7.

Repair shunt 110 thus provides a low noise (e.g., a median volume of less than 1600 electrons/pixel) electrical bypass around electrical defect 32 in data line 7 and enables data line 7 to be used to coupled to the pixels in the column to readout electronics (not shown) attached to the data line at the edge of the array. Only two pixels in the array—first repair pixel 100 and second repair pixel 101—are disabled as a result of the repair; as the array typically comprises many thousands of pixels overall, loss of the two pixels does not substantially affect operation of the array. Pixels 100 and 101 are disabled as the respective scan line segments controlling operation of the FET for these pixels is electrically isolated to form the respective scan line segments for repair shunt 110.

The method of the present invention is readily used to repair a damaged address line, even after the pixel array components have been fabricated. Typically, following the repair, a passivation layer is deposited over the pixel array to seal the upper surface of the pixel array electrically and from the environment. Common passivation materials include inorganic dielectric materials (e.g., silicon nitride, silicon oxide, combinations thereof, and the like) and organic dielectric materials (e.g., polyimide), or combinations thereof. Deposition of the passivation material over the repair shunt (and especially the respective weld connections between the components of the repair shunt and between the repair shunt and the defective data line) serve to seal the repair and enhance low noise operation of the repaired data line.

The practice of the present invention provides for the repair of the data transmission lines for imagers using diode common electrode lines formed of molybdenum or alternatively formed of indium tin oxide (ITO) layers.

While certain features of the invention have been illustrated and described herein, many modifications and changes will occur to those skilled in the art. It is, therefore, to be understood that the appended claims are intended to cover all such modifications and changes as fall within the true spirit of the invention.

We claim:

1. A method of repairing an imager having a data address line with an electrical defect therein, the imager having a plurality of pixels arranged in an array of rows and columns and further having a plurality of address lines including scan lines disposed along respective rows; a plurality of data lines arranged along respective columns, and a plurality of common electrode lines oriented substantially parallel to said data lines, said the method comprising the steps of:

forming a repair shunt comprising a first pixel scan line segment, a common electrode segment, and a second scan line segment; and fusing said repair shunt to the defective data address line such that said repair shunt provides electrical bypassing of the data line electrical defect.

2. The method of claim 1 wherein the step of forming a repair shunt further comprises the steps of:

electrically isolating said first pixel scan line segment from a fist pixel scan line in the pixel array;

electrically isolating said second pixel scan line segment from a second pixel scan line in the pixel array; and electrically isolating said common electrode segment from a respective pixel common electrode line.

3. The method of claim 2 wherein the step of electrically isolating said pixel scan line segments and said common electrode segment comprises applying a laser to ablate conductive material so as to create an open circuit condition between the respective repair shunt segments and remaining portions of the respective address lines from which said segments were formed.

4. The method of claim 2 wherein the step of forming said repair shunt further comprises the steps of:

fusing said first pixel scan line segment to said common electrode segment; and fusing said common electrode segment to said second pixel scan line segment;

said fusing including applying a laser to weld conductive portions of the respective repair shunt segments together.

5. The method of claim 4 wherein the step of fusing said first pixel line segment to said common electrode segment and fusing said common electrode segment to said second pixel scan line segment each comprise the step of forming a respective weld connection at a respective common electrode-scan line crossover point.

6. The method of claim 5 wherein each of said respective weld connections is formed in the region of a respective weld pad on said scan lines, the location of said weld pads on said respective scan lines corresponding with respective common electrode-scan line crossover points.

7. The method of claim 1 wherein the step of fusing said repair shunt to the defective data address line comprises the steps of:

fusing said first pixel scan line segment to a first portion of said defective address line via at least one first scan line welding connection, and;

fusing said second pixel scan line segment to a second portion of said defective address line via at least one second scan line welding connection;

said fusing including applying a laser to form said welding connections.

8. The method of claim 6 wherein said first and second scan line welding connections each comprise a weld connection selected from the group of a scan-data line crossover weld connection, a pixel field effect transistor (FET) weld connection, and a combination of both said scan-data line crossover weld connection and said pixel FET weld connection.

9. The method of claim 8 wherein at least one of said scan-data line crossover weld connections is formed in the region of a respective weld pad on said scan lines, the location of said weld pads on said respective scan lines corresponding with respective data line-scan line crossover points.

10. The method of claim 1 wherein said electrical defect in said data line is disposed adjacent to a first pixel coupled to the defective data line; and wherein said first pixel scan line segment comprises a portion of a first scan line coupled to a respective switching transistor for said first pixel;

said second pixel scan line segment comprises a portion of a second scan line, said second scan line being disposed on the opposite side of said first pixel from first scan line; and said common electrode segment comprising a portion of a common electrode line coupled to the photosensor in said first pixel.

11. The method of claim 1 further comprising the step of depositing a passivation layer over the pixel array after fusing said repair shunt to said defective data line.

12. A method for repairing address lines of a solid state radiation imager, said address lines comprising respective pluralities of data lines and scan lines, said imager further comprising a plurality of diodes having diode common electrode lines, said imager being arranged into a matrix of elements arranged in rows and columns which define coordinates to specify the location of any row or any column or any data, scan and diode common electrode lines of said imager, respective ones of said scan lines defining said rows and said columns being defined by respective ones of said data lines, wherein the intersections of said scan and data transmission lines define scan-data line crossover elements and the intersections of said scan lines and said diode common electrode lines define scan-diode common electrode crossover elements, said method comprising:

(a) providing a plurality of weld pads, each in its unwelded state but capable of being welded by the application of heat, said plurality of weld pads being disposed on respective scan lines so that at least one weld pad is located at each of said scan-data line crossover elements and at each of said scan-diode common electrode line crossover elements;

(b) examining said imager to identify a data line electrical defect in a data line to be repaired;

(c) defining the coordinates of said electrical defect in said data line to be repaired;

(d) defining the coordinates of the scan-data line crossover elements that are in closest proximity to said electrical defect in said data line to be repaired;

(e) defining the coordinates of the scan-diode common electrode crossover elements that are adjacent the defined coordinates of the scan-data line crossover elements;

(f) heating said weld pads at said defined scan-data line crossover elements and at the defined scan-diode common electrode crossover elements so that the respective scan and data transmission lines are joined and so that the respective scan and diode common transmission lines are also joined;

(g) severing the respective scan transmission lines at respective scan line first and second sever to respective scan line repair segments electrically isolated from the remaining portions of said respective scan lines; and (h) severing the respective diode common electrode line to form a common electrode repair segment electrically isolated from remaining portions of said common electrode line.

13. The method according to claim 12, wherein said imager further comprises a plurality of respective pixel switching transistors, and wherein said method further comprises the step of heating said switching element so as to fuse the respective switching transistors adjacent said defined scan-data line crossover elements into a conductive state so as to couple said respective scan line repair segments to the data line having said electrical defect.

14. A solid state radiation imager that has been repaired to correct for an electrical defect in an address line, comprising:

a plurality of pixels arranged in an array of rows and columns;

a plurality of address lines further comprising a plurality of scan lines disposed along respective rows; a plurality of data lines arranged along respective columns, and a plurality of common electrode lines oriented substantially parallel to said data lines; and a repair shunt comprising a first pixel scan line segment, a common electrode segment, and a second scan line segment, said repair shunt being electrically isolated from said plurality of scan lines and common electrode lines and electrically coupled to a repaired data line so as to electrically bypass said electrical defect in said repaired data line.

15. The imager of claim 14 wherein said electrical defect in said repaired data line is disposed adjacent to a first pixel coupled to said repaired data line; and wherein said first pixel scan line segment comprises a portion of a first scan line coupled to a respective switching transistor for said first pixel;

said second pixel scan line segment comprises a portion of a second scan line, said second scan line being disposed on the opposite side of said first pixel from first scan line; and said common electrode segment comprising a portion of a common electrode line coupled to the photosensor in said first pixel.

16. The imager of claim 14 wherein said said first pixel scan line segment is electrically isolated from remaining portions of said fist pixel scan line in the pixel array;

said second pixel scan line segment is electrically isolated from remaining portions of said second pixel scan line in the pixel array; and said common electrode segment is electrically isolated from remaining portions of said respective pixel common electrode line.

17. The imager of claim 14 wherein said first scan line repair segment and said second scan line repair segment are electrically coupled to said repaired data line at respective first and second scan line weld connections, and said first and second scan line weld connections each comprise a weld connection selected from the group of a scan-data line crossover weld connection, a pixel field effect transistor (FET) weld connection, and a combination of both said scan-data line crossover weld connection and said pixel FET weld connection.

18. The imager of claim 17 wherein at least one of said scan-data line crossover weld connections is formed in the region of a respective scan line-data line weld pad on said scan lines, the location of said weld pads on said respective scan lines corresponding with respective data line-scan line crossover points.

19. The imager of claim 18 further comprising a plurality of common electrode-scan line crossover point weld pads.

20. The imager of claim 19 wherein said data lines comprise molybdenum and said scan transmission lines comprise a material selected from the group consisting of chromium, molybdenum, or a composition of chromium and molybdenum.

21. The imager of claim 14 wherein said common electrode lines comprise indium tin oxide (ITO).

* * * * *